(12) United States Patent
Nielson et al.

(10) Patent No.: US 8,614,395 B1
(45) Date of Patent: Dec. 24, 2013

(54) SOLAR CELL WITH BACK SIDE CONTACTS

(75) Inventors: Gregory N. Nielson, Albuquerque, NM (US); Murat Okandan, Edgewood, NM (US); Jose Luis Cruz-Campa, Albuquerque, NM (US); Paul J. Resnick, Albuquerque, NM (US); Mark Woodbury Wanlass, Golden, CO (US); Peggy J. Clews, Tijeras, NM (US)

(73) Assignee: Sandia Corporation, Albuquerque, NM (US)

( * ) Notice: Subject to any disclaimer, the term of this patent is extended or adjusted under 35 U.S.C. 154(b) by 113 days.

(21) Appl. No.: 13/164,017

(22) Filed: Jun. 20, 2011

Related U.S. Application Data

(63) Continuation-in-part of application No. 12/914,441, filed on Oct. 28, 2010, which is a continuation-in-part of application No. 11/933,458, filed on Nov. 1, 2007, application No. 13/164,017, which is a continuation-in-part of application No. 12/957,082, filed on Nov. 30, 2010, now Pat. No. 8,329,503, which is a continuation-in-part of application No. 11/933,458, filed on Nov. 1, 2007.

(51) Int. Cl.
*H01L 31/00* (2006.01)
*H01L 21/00* (2006.01)

(52) U.S. Cl.
USPC .......................................... 136/256; 438/57

(58) Field of Classification Search
USPC .......................................... 136/256; 438/57
See application file for complete search history.

(56) References Cited

U.S. PATENT DOCUMENTS

| | | | |
|---|---|---|---|
| 5,482,568 A | 1/1996 | Hockaday | |
| 5,501,893 A | 3/1996 | Laermer et al. | |
| 5,998,729 A * | 12/1999 | Shiomi et al. | 136/251 |
| 6,359,210 B2 * | 3/2002 | Ho et al. | 136/256 |
| 6,612,705 B1 | 9/2003 | Davidson et al. | |
| 6,624,548 B1 | 9/2003 | Miller et al. | |
| 6,805,998 B2 * | 10/2004 | Jenson et al. | 429/162 |
| 6,957,894 B2 | 10/2005 | Rabinowitz et al. | |
| 6,964,486 B2 | 11/2005 | Rabinowitz | |
| 6,987,604 B2 | 1/2006 | Rabinowitz et al. | |
| 6,988,809 B2 | 1/2006 | Rabinowitz | |
| 7,077,361 B1 | 7/2006 | Rabinowitz | |

(Continued)

OTHER PUBLICATIONS

Li, W. et al., "GaInP/AlInP tunnel junction for GaInP/GaAs tandem solar cells", Electronic Letters, Feb. 19, 1998, vol. 34, No. 4, pp. 406-407.*

(Continued)

*Primary Examiner* — Tamir Ayad
(74) *Attorney, Agent, or Firm* — Medley Behrens & Lewis LLC; Michael J. Medley; Olivia J. Tsai

(57) ABSTRACT

A III-V solar cell is described herein that includes all back side contacts. Additionally, the positive and negative electrical contacts contact compound semiconductor layers of the solar cell other than the absorbing layer of the solar cell. That is, the positive and negative electrical contacts contact passivating layers of the solar cell.

5 Claims, 5 Drawing Sheets

(56) References Cited

U.S. PATENT DOCUMENTS

| | | | |
|---|---|---|---|
| 7,172,789 | B2 | 2/2007 | Smith et al. |
| 7,217,883 | B2 | 5/2007 | Munzer |
| 7,244,326 | B2 | 7/2007 | Craig et al. |
| 7,251,882 | B2 | 8/2007 | Ricks et al. |
| 7,517,709 | B1 | 4/2009 | Borden |
| 7,659,475 | B2 | 2/2010 | Agostinelli et al. |
| 7,763,535 | B2 | 7/2010 | Trassl et al. |
| 7,812,250 | B2 | 10/2010 | Smith |
| 7,851,698 | B2 | 12/2010 | De Ceuster et al. |
| 2003/0070707 | A1* | 4/2003 | King et al. .............. 136/255 |
| 2005/0224111 | A1* | 10/2005 | Cunningham et al. ...... 136/256 |
| 2010/0224237 | A1 | 9/2010 | Kim |
| 2011/0089420 | A1 | 4/2011 | Prabhakar |

OTHER PUBLICATIONS

R. A. Sinton, et al., "Silicon Point Contact Concentrator Solar Cells" IEEE Electron Device Letters, vol. EDL-6, No. 8, Aug. 1985, pp. 405-407.

R. A. Sinton, et al., "Design Criteria for Si Point-Contact Concentrator Solar Cells," IEEE Transactions on Electron Devices, vol. ED-34, No. 10, Oct. 1987, pp. 2116-2123.

Ulhara Srinivasan, et al., "Microstructure to Substrate Self-Assembly Using Capillary Forces," Journal of Microelectromechanical Systems, vol. 10, No. 1, Mar. 2001, pp. 17-24.

WC Sweatt, et al., "Micro-optics for high-efficiency optical performance and simplified tracking for concentrated photovoltaics (CPV)," Conference Paper, International Optical Design Conference (IODC), Jackson Hole, WY, Jun. 13, 2010.

Van Kerschaver, et al., "Back-Contact Solar Cells: A Review", Prog. Photovolt: Res. Appl. 2006; 14. pp. 107-123.

Nielson, et al., "Microscale C-Si (C)PV Cells for Low-Cost Power", 34th IEEE PVSC, 2009. pp. 1816-1821.

Nielson, et al., "Microscale PV Cells for Concentrated PV Applications", 24th EU PVSEC, 2009. pp. 170-173.

Guo, et al., "Two- and Three-Dimensional Folding of Thin Film Single-Crystalline Silicon for Photovoltaic Power Applications", PNAS 106, 2009. pp. 20149-20154.

Lee, et al., "Thin Film GaAs Solar Cells on Glass Substrates by Epitaxial Liftoff", 25th PVSC; May 13-17, 1996, pp. 53-55.

Wilt, et al., "Peeled Film GaAs Solar Cell Development", Photovoltaic Specialists Conference, May 1990. pp. 111-114.

* cited by examiner

SOLAR CELL WITH BACK SIDE CONTACTS

CROSS-REFERENCE TO RELATED APPLICATIONS

This application is a continuation-in-part of U.S. patent application Ser. No. 12/914,441, filed on Oct. 28, 2010, which is a continuation-in-part of U.S. patent application Ser. No. 11/933,458, filed on Nov. 1, 2007. This application is additionally a continuation-in-part of U.S. patent application Ser. No. 12/957,082, filed on Nov. 30, 2010, now U.S. Pat. No. 8,329,5003 which is also a continuation-in-part of U.S. patent application Ser. No. 11/933,458, filed on Nov. 1, 2007. The entireties of these applications are incorporated herein by reference.

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

As concerns continue to mount with respect to carbon emissions associated with conventional electric power generation systems, additional funding and research has been undertaken with respect to systems that use renewable energy resources, such as solar power, wind power, geothermal energy, and the like. With more particularity regarding solar cells, such solar cells are designed to convert at least a portion of available light into electrical energy. Solar cells are generally based upon semi-conductor physics, wherein a solar cell comprises a PN junction photodiode with a light sensitive area. The photovoltaic effect, which causes a solar cell to convert light directly into electrical energy, occurs inside a semiconductor material where light knocks off electrons. Because of the structure of the cell, there is an induced field that causes the electrons to flow in one direction and collect at the terminals. The structure of the solar cell is based in a PN junction composed of two layers: a p-type semiconductor and an n-type semiconductor. The interface where the two join is referred to as a junction.

For enhanced performance in GaAs solar cells, two additional layers, which are electrical contact layers, are also present. These contact layers enhance electric current that flows out of and into the solar cell. In conventional designs for solar cells that include compound semiconductors, the electrical contact layers reside on opposing sides of solar cells (a front side and a back side, respectively). The front side of the cell is the side that is configured to be directed towards a light source (the Sun) to receive radiation. Typically, the electrical contact layer on the front side of the cell is formed in a grid-like pattern, which includes a plurality of metallic fingers that are manufactured to be as small as possible so as to limit blockage of light prior to the light reaching the absorber region. The electrical contact layer on the back side of the solar cell generally covers the entire back side of the solar cell.

Manufacturing a solar cell with all backside contacts has been extensively explored, particularly for silicon solar cells. This type of solar cell has the advantage of all metallization residing on the back of the cell, giving the opportunity to independently optimize the front and back of the cell for optical and electrical performance, respectively. Back contacted solar cells are ideal for concentration applications, and researchers have been able to create 27.5% efficient silicon cells under 100 suns. Silicon, however, is an indirect band gap semiconductor, which requires a thick layer of material to absorb the solar spectrum. Currently, manufacture of an efficient all-back side solar cell that includes compound semiconductors has not been achieved.

SUMMARY

The following is a brief summary of subject matter that is described in greater detail herein. This summary is not intended to be limiting as to the scope of the claims.

Described herein are various technologies pertaining to a solar cell that comprises a compound semiconductor with all back side electrical contacts. That is, both a positive electrical contact and a negative electrical contact reside on the same side of the solar cell that comprises the compound semiconductor. Pursuant to an example, the compound semiconductor can be gallium arsenide (GaAs). The solar cell comprises the two absorbing layers: the p-type semiconductor layer and the n-type semiconductor layer. A PN junction is created where the two layers meet. As a described above, the p-type semiconductor and the n-type semiconductor can be made of GaAs. Furthermore, the solar cell can comprise confinement layers that surround the absorbing layers. As used herein, the term "confinement layer" is intended to encompass a window layer or passivating layer, while the absorbing layers can be collectively referred to herein as an absorbing layer. Thus, the absorbing layer resides between a first confinement layer and a second confinement layer. In the solar cell described herein, the electrical contacts are made at the respective confinement layers or beyond rather than at the absorbing layer.

The solar cell can be manufactured by growing a plurality of layers by way of epitaxy on a GaAs wafer. In an example, a buffer layer may be grown on the GaAs wafer, followed by a release layer, which may be composed of aluminum arsenide (AlAs). A first confinement layer, which may be, for instance, gallium indium phosphorus (GaInP), can be grown on the release layer using epitaxy. An n-doped layer of GaAs may then be grown on top of the first confinement layer followed by a p-doped layer of GaAs, thereby creating the PN junction. A second GaInP confinement layer may be grown by epitaxy on the p-doped GaAs layer, and a GaAs p-doped contact layer may be grown on the second confinement layer. Selective etching may then be employed on this stack of compound semiconductors to reach the first confinement layer (that resides beneath the n-doped GaAs layer). A metallization step may then be undertaken to coat the cell with metal, and etching can be employed to pattern the metal to create metal contact pads on the first confinement layer and the GaAs p-doped contact layer. A similar technique may be used to create the metal pads contacting the second confinement layer. The metal contact pads may comprise gold or silver. Following the placing of the metal contact pads thereon, the solar cell can be released from the wafer by placing the GaAs wafer in a particular solution (such as Hydrofluoric Acid) that selectively etches the release layer from the wafer, thereby freeing the cell from the wafer. The wafer may then be reused in the manufacturing of other solar cells.

Other aspects will be appreciated upon reading and understanding the attached Figs. and description.

DETAILED DESCRIPTION

Figure 1:
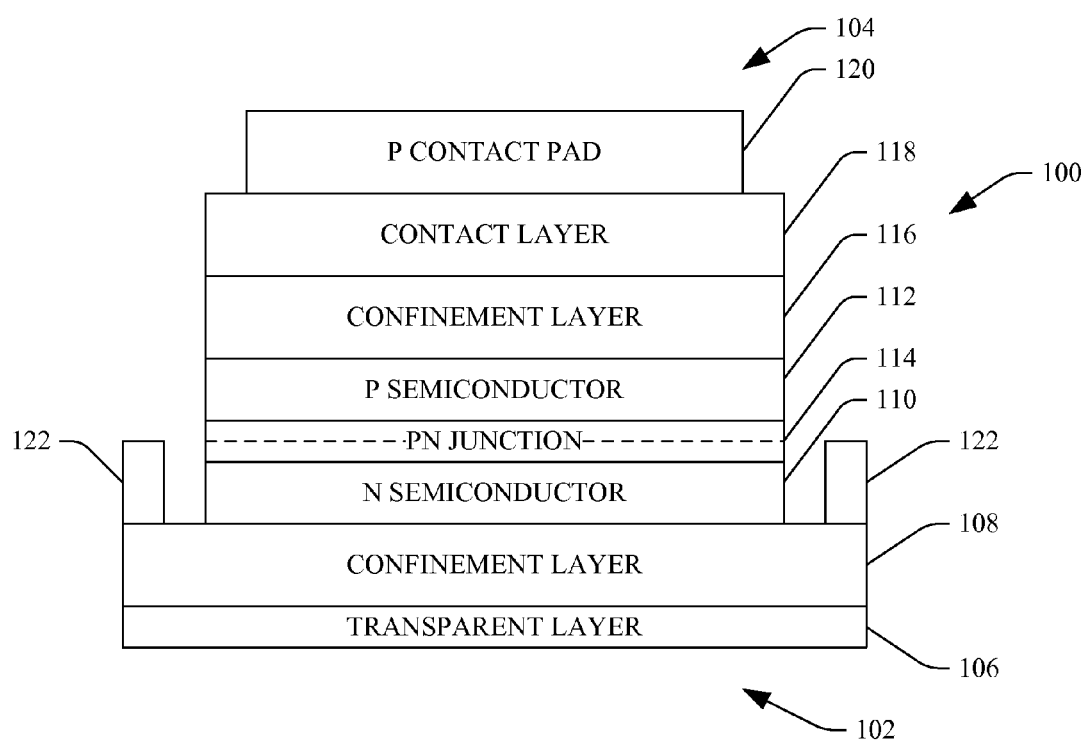
FIG. 1 illustrates a cutaway view of an exemplary solar cell.

Various technologies pertaining to a solar cell that comprises compound semiconductors (e.g., a III-V solar cell) will now be described with reference to the drawings, where like reference numerals represent like elements throughout. Additionally, as used herein, the term "exemplary" is intended to mean serving as an illustration or example of something, and is not intended to indicate a preference. Further, as used herein, the term "approximately" is intended to encompass values within fifteen percent of a specified value.

Described herein is a relatively small solar cell, wherein microsystem tools are utilized to manufacture such solar cell. The cell has few, if any, shading effects, thereby allowing more light to reach absorbing layers of the solar cell. The cell includes all back-side contacts, thereby increasing ease in which the solar cell is packaged and interconnected with other solar cells in a solar panel. For example, connecting several of the cells described herein in series may allow high voltages in small areas. The metal stack survives acid etches to release the cell from a wafer, and the cell can be used by itself or stacked with other cells in unique configurations and small form factors.

With reference now to FIG. 1, an exemplary solar cell 100 that comprises a plurality of layers of compound semiconductors is illustrated. For instance, the compound semiconductors may be III-V semiconductors. The solar cell 100 has a front side 102 and a back side 104 that is opposite the front side 102. In operation, the solar cell 100 is positioned such that light is received through the front side 102 of the solar cell 100. In an exemplary embodiment, the solar cell 100 comprises a transparent packaging layer 106 that is composed of a transparent material such as glass, a clear plastic film, or the like. The packaging layer 106 is configured to allow light to be received by semiconductor layers in the solar cell 100 while protecting the solar cell 100 from exterior influences, such as weather, abrasive elements, or the like.

The exemplary solar cell 100 additionally comprises a first confinement layer 108 that is positioned directly above (immediately adjacent to) the packaging layer 106. Pursuant to an example, the first confinement layer 108 may be approximately 1 micrometer in thickness. Additionally, pursuant to an example, the first confinement layer 108 may be composed of the compound semiconductor gallium indium phosphorus (GaInP).

The exemplary solar cell 100 further comprises an n-type semiconductor layer 110. For instance, the n-type semiconductor layer 110 may be composed of a compound semiconductor such as gallium arsenide (GaAs). Furthermore, the n-type semiconductor layer 110 may be approximately 100 nm in thickness with a density of charge carriers of approximately $1\times10^{18}/cm^3$.

The solar cell 100 further comprises a p-type semiconductor layer 112 that is grown on the n-type semiconductor layer 110 through, for instance, epitaxy. The p-type semiconductor layer 112 may be composed of a compound semiconductor such as p-doped GaAs. For instance, the p-type semiconductor layer 112 may be approximately 1.6 micrometers thick, with a density of charge carriers of approximately $1-5\times10^{18}/cm^3$. A pn junction is created at the intersection of the n-type semiconductor layer 110 and the p-type semiconductor layer. As can be ascertained, the pn junction extends across the solar cell 100 substantially parallel to the front side 102 and the back side 104. The combination of the n-type semiconductor layer 110 and the p-type semiconductor layer 112 (and thus the PN junction) can be collectively referred to as an absorbing layer of the solar cell 100.

A second confinement layer 116 is positioned immediately above the p-type semiconductor layer 112. The second confinement layer 116 may be composed of GaInP, and may be approximately 25 nm thick. Additionally, the density of charge carriers of the second confinement layer 116 may be approximately the same as the density of charge carriers of the first confinement layer 108.

The solar cell 100 can further comprise a p-doped contact layer 118 that can be grown by way of epitaxy on the second confinement layer 116. In an example, the contact layer 118 may be composed of a GaAs semiconductor that is approximately 0.50 nm thick.

The exemplary solar cell 100 additionally comprises a metallic positive contact pad 120 that is placed upon the contact layer 118. For instance, the positive contact pad 120 can be composed of a first layer of chromium followed by a layer of gold. In an example, the chromium layer may be approximately 10 nm thick, and the layer of gold may be approximately 100 nm thick. It is to be understood that the positive contact pad 120 is placed on the contact layer 118, but can alternatively be placed on the second confinement layer 116. However, as can be ascertained, the positive contact pad 120 is not placed on the absorbing layer of the solar cell 100. Instead, the positive contact pad 120 is placed on what is known in the art as a passivating layer or a window layer (which can be the contact layer 118 and/or the second confinement layer 116).

Figure 1A:
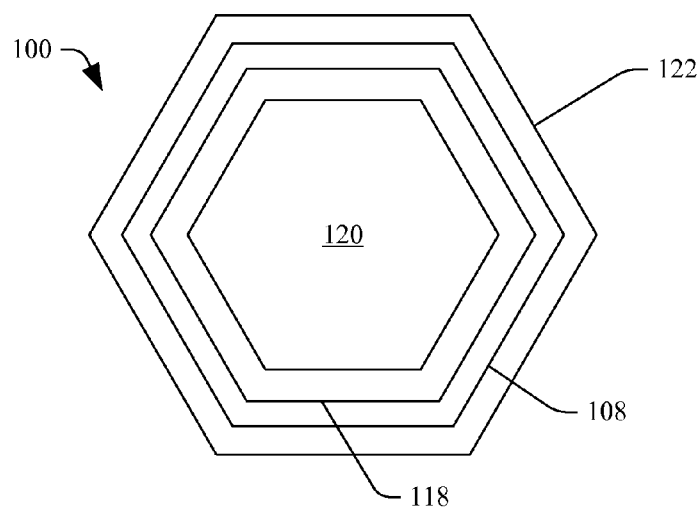
FIG. 1A illustrates an overhead view of the exemplary solar cell.

The exemplary solar cell 100 further comprises a negative contact pad 122, which as shown in FIG. 1A, can extend around the periphery of the solar cell 100. The negative contact pad 122 may again be composed of a conductive metal such as, for instance, a combination of chromium and gold. For example, the negative contact pad 122 may be composed of approximately 10 nm of chromium (to enhance adhesion) followed by 100 nm of gold. As shown, the negative contact pad 122 extends from the first confinement layer 108, rather than the absorbing layer of the solar cell 100. In alternative embodiments, the negative contact pad 122 may be contacting layers further from the absorbing layer of the solar cell 100 (e.g., additional semiconductor compounds can be grown beneath the confinement layer 108).

The exemplary solar cell 100 may be used in a variety of applications for generating electrical power. For instance, the solar cell 100 may be placed proximate to a concentrating lens that concentrates solar radiation on the front side 102 of the solar cell 100. In another exemplary embodiment, the solar cell 100 may be placed on a consumer device, such as a mobile telephone, a mobile gaming apparatus, a tablet computing device, or the like for generating electrical power for such a device. Still further, the solar cell 100 may be included in an array of solar cells and placed together to generate electrical power in a solar panel on a permanent or semi-permanent structure, such as a building. Other applications will be contemplated and are intended to fall under the scope of the hereto-appended claims.

Still further, due to the relatively small size of the solar cell 100 and the materials used in manufacturing the solar cell 100, a solar panel built with several solar cells such as the solar cell 100 may have a relatively small radius of curvature. For example, a solar panel made out of cells such as the solar cell 100 can bend to a radius of curvature ranging from 2 mm up to 10 cm. Accordingly, the solar cell 100 may be placed on a curved supporting surface if desired.

Moreover, as shown, both the positive contact pad 120 and the negative contact pad 122 are exposed on the back side 104 of the solar cell 100. Therefore, the conductive metals of the contact pads 120 and 122 do not block light from reaching the absorbing layer of the solar cell 100. This arrangement enhances efficiency of conversion of solar radiation into electrical power over conventional III-V solar cell designs.

Additionally, while the solar cell 100 is shown as a single junction cell, it is to be understood that the solar cell 100 may be a multi junction cell that includes at least one additional absorbing layer, which can comprise a p-type and n-type compound semiconductor that is selected based upon a band gap corresponding to such semiconductor. As described above, the p-type semiconductor layer 112 and the n-type semiconductor layer 110 can be composed of GaAs. For instance, the solar cell 100 may include another p-type semiconductor layer and another n-type semiconductor layer that are composed of indium gallium phosphide (InGaP). In another exemplary embodiment, the solar cell 100 may include an absorbing layer that comprises an n-type indium gallium arsenide (InGaAs) layer and a p-type InGaAs layer. The multi junction cell may be manufactured through epitaxy or through stacking solar cells with absorbing layers composed of different compound semiconductors selected based upon band gaps of such semiconductors.

With reference briefly to FIG. 1A, an exemplary plan view of the back side 104 of the solar cell 100 is shown. For instance, the solar cell 100 may be hexagonal in shape, although other suitable shades are contemplated. As shown, the negative contact pad 122 can reside at the periphery of the back side 104 of the solar cell 100, while the positive contact pad 120 can reside over the center of the back side 104 of the solar cell 100. As will be described herein, additional processing can be undertaken to lift off a portion of the positive contact pad 120 such that a window exists through the solar cell 100, thereby preventing blockage of light as light passes through the solar cell 100. In such an approach, the solar cell 100 can be stacked with a second solar cell, wherein the second solar cell comprises an absorbing layer composed of a compound semiconductor of a different band gap than the compound semiconductor used in the solar cell 100.

Figure 2:
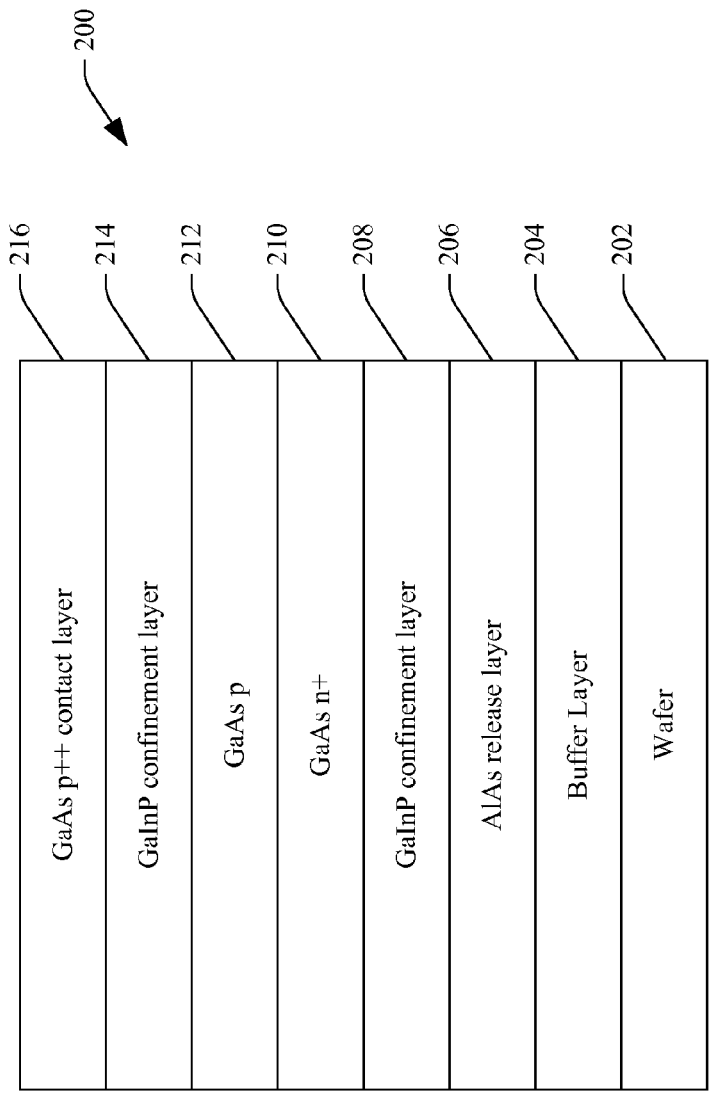
FIG. 2 illustrates a cutaway view of an exemplary stack of compound semiconductors that are grown in connection with manufacturing a solar cell.

Now referring to FIG. 2, a cutaway view of an exemplary semiconductor stack 200 that can be utilized in connection with manufacturing the solar cell 100 shown in FIG. 1 is illustrated. Pursuant to an example, the semiconductor stack 200 can be grown by metal organic vapor phase epitaxy. Photolithic masks can be designed to create one or more solar cells from the semiconductor stack 200 in a variety of sizes including, but not limited to, 2 mm, 1 mm, 500 µm, and 250 µm diameter sizes. Different sizes can have different design variations with varying densities of etch release holes. Etch release holes are perforations that travel from the front of a wafer to a release layer such that chemistry can access the release layer.

The semiconductor stack 200 can comprise a wafer 202. For instance, the wafer 202 may be a GaAs wafer that can be patterned using standard photolithography. A buffer layer 204 can be grown on the wafer 202 to protect the wafer 202 during release of a manufactured solar cell. An AlAs release layer 202 can be grown by epitaxy on the buffer layer 204, wherein the AlAs release layer 202 may be approximately 50 nm in thickness.

Thereafter, a first GaInP confinement layer 208 can be grown on the AlAs release layer 206, and an n-type GaAs layer 210 is grown on the first confinement layer 208. A p-type GaAs layer 212 is grown directly upon the n-type GaAs layer 210, as described above. This creates a PN junction between the two GaAs layers 210 and 212. A second GaInP confinement layer 214 can be grown on the p-type GaAs layer 212, and a GaAs p-type contact layer 216 can be grown on the second confinement layer 214.

Once the semiconductor stack 200 is grown, lithography and/or various etches (wet or dry etches) can be used to etch to at least the first confinement layer 208 in the semiconductor stack 200. The remaining structure is then subject to metallization, where metal is put down on the semiconductor stack 216 and liftoff is utilized to pattern the metal. A directional etch may then be employed to access the AlAs release layer 206, and such release layer 206 is etched away entirely to release the resulting solar cell from the wafer 202. This process can result in the creation of a relatively thin solar cell in the range of 5 µm. Additionally, the wafer 202 can be utilized to process additional solar cells.

A particular example of etching processes that can be utilized on the semiconductor stack 200 to generate the solar cell 100 will not be provided. It is to be understood, however, that this process is but one exemplary approach for etching the semiconductor stack 200 to generate the solar cell 100, and that other approaches are contemplated and are intended to fall under the scope of the hereto appended claims. Pursuant to an example, the GaAs contact layer 216 can be etched by submerging the semiconductor stack 200 in a 1:4:45 solution of $H_3PO_4$: $H_2O_2$: $H_2O$. Thereafter, the second confinement layer 214 can be targeted using, for instance, a 7:1 solution of $H_3PO_4$: HCl in which the semiconductor stack 200 can be submerged for approximately 14 seconds. Thereafter, the same chemistry used to remove the contact layer 216 ($H_3PO_4$: $H_2O_2$: $H_2O$) can be utilized to remove the p-type GaAs layer 212 and the n-type GaAs layer 210. For instance, etching can be done by submerging the semiconductor stack 200 in such solution for approximately 462 seconds. The advantage of using this chemistry is its selectivity as it only etches GaAs leaving the GaInP layers 208 and 214 intact.

Subsequently, the resulting semiconductor stack 200 can be subjected to cleaning, and a second photolithography mask can be used to define metal contact pads. Specifically, subsequent to a photoresist pattern being formed, a metal layer can be deposited and the photoresist can be removed to lift off unwanted metal. As mentioned above, the metal layer can be composed of approximately 10 nm of chromium to enhance adhesion followed by 100 nm of gold.

Another photolithographic step can then be undertaken to define the size of solar cells manufactured from the semiconductor stack 200 as well as the release holes. Photoresist can be employed to protect the cells while leaving boundaries between individual cells uncovered. Thereafter, the semiconductor stack 200 can undergo a reactive ion etch, thereby removing material to access the AlAs release layer 206 of the semiconductor stack 200. With the release layer 206 being accessible, the semiconductor stack 200 can be submerged into an HF-based solution to detach the cells from the wafer 202. Specifically, the release layer 206 can be selectively etched using a solution composed of approximately 49% HF in water with Tergitol, which can be added to prevent cells from sticking to the wafer 202 once released. Due the resulting small size of the solar cells, the liftoff process can be completed in approximately 8 minutes, which is in contrast to the several days required for epitaxy liftoff of a full wafer. Various methods can be utilized to contact the resulting cells. For instance, a relatively small amount of silver paste can be placed on the resulting contact pads. In another example, contact can be made using gold wire bonds. It is to be understood, however, that any suitable method for contacting the solar cells at the contact pads is contemplated.

Figure 3:
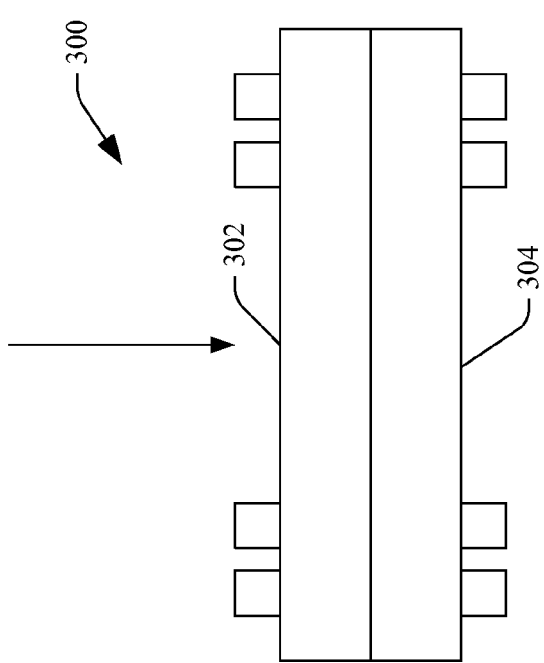
FIG. 3 illustrates an exemplary stacking of two solar cells that are composed of the compound semiconductors.

Referring now to FIG. 3, a cutaway side view 300 of an exemplary stacking of solar cells is illustrated. The cutaway view 300 illustrates a first solar cell 302 and a second solar cell 304, wherein both the first and second solar cells 302 and 304, respectively, have positive and negative contacts on backsides of the solar cells. As shown, during metal liftoff, a window can be created through at least one of the solar cells, such that a positive contact pad does not block light that has traveled through an absorbing region of the at least one of the solar cells. Pursuant to an example, the first solar cell 302 may have an absorbing layer that is composed of a first compound semiconductor, while the second solar cell 304 may have an absorbing layer that is composed of a second compound semiconductor that has a different band gap when compared to the band gap of the first compound semiconductor.

Figure 4:
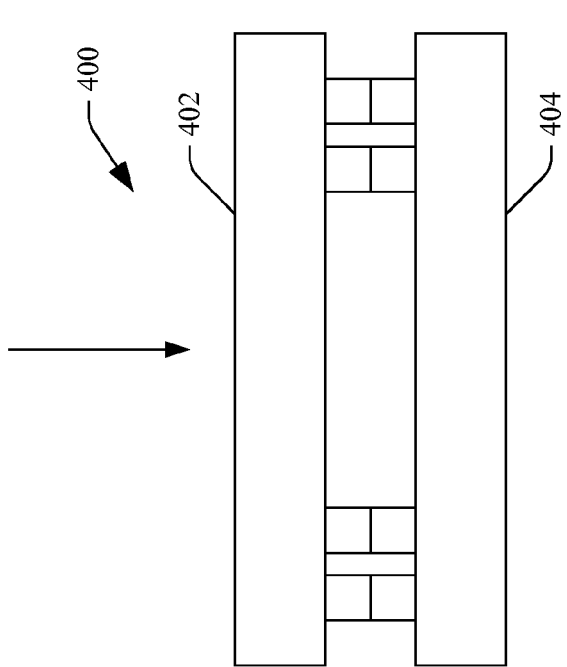
FIG. 4 illustrates another exemplary stacking of solar cells that comprise compound semiconductors.

With reference now to FIG. 4, a cutaway side view 400 of another exemplary stacking of solar cells is illustrated. The side view 400 illustrates first and second solar cells 402 and 404, which can be manufactured as described above. Accordingly, both the first solar cell 402 and the second solar cell 404 can comprise positive and negative contact pads, respectively, that are on the back side of the solar cells 402 and 404. The positive and negative contact pads are shown as being in contact with one another. Of course, other exemplary configurations are also contemplated.

Figure 5:
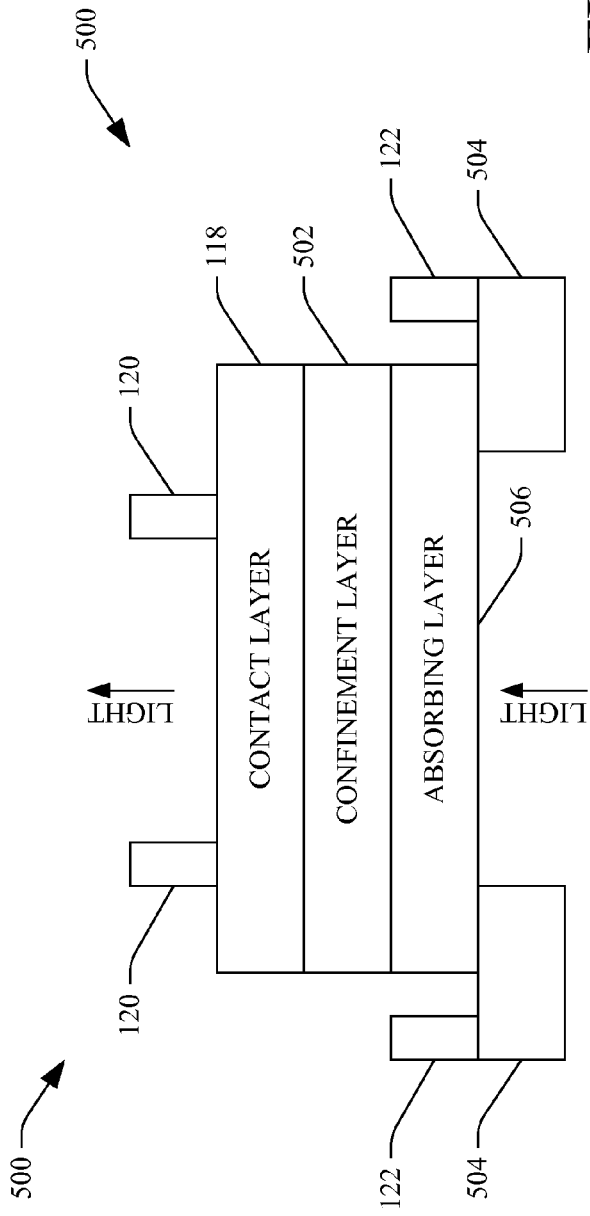
FIG. 5 illustrates an exemplary structure of a solar cell that comprises compound semiconductors.

With reference now to FIG. 5, an exemplary solar cell 500 is illustrated. Here, the solar cell 500 comprises a first confinement layer 502 and a second confinement layer 504 that surrounds an absorbing layer 506. For example, the absorbing layer 506 can comprise the n-type semiconductor layer 110 and the p-type semiconductor layer 112 as shown in FIG. 1. The solar cell 500 further comprises the contact layer 118. The positive contact pad 120 is positioned on the top of the contact layer 118 and is etched such that a window exists through the contact layer 118. In other words, a photolithographic mask can be utilized to selectively lift off a center portion of metal applied to the contact layer 118 such that light that passes through the absorbing layer 502 and the confinement layer 506 is not blocked by the positive contact pad 506. The solar cell 500 additionally includes the negative contact pad 122 that contacts the first confinement layer 504, rather than the absorbing layer 502.

As described above, the solar cell 100 shown in FIG. 1 can be selectively released from a wafer, and thereafter a protective coating can be placed on the front side 102 of such solar cell. It is to be understood, however, that additional processing may be undertaken on the front side 102 to create an aperture in the first confinement layer 504 such that a smaller amount of solar radiation is attenuated by the first confinement layer. This can increase the efficiency of the solar cell 500, as the negative contact pad 122 remains in contact with the first confinement layer 504 and not the absorbing layer 502, while the first confinement layer 504 does not attenuate light that is desirably received by the absorbing layer 502. That is, subsequent to the processing described above, the solar cell 500 can be flipped and additional action can be undertaken on the front side of the solar cell 500. For instance, the backside of the solar cell can be placed on a substrate, while etching (wet or dry) or other suitable processes can be undertaken on the front side of the solar cells to improve efficiency.

Figure 6:
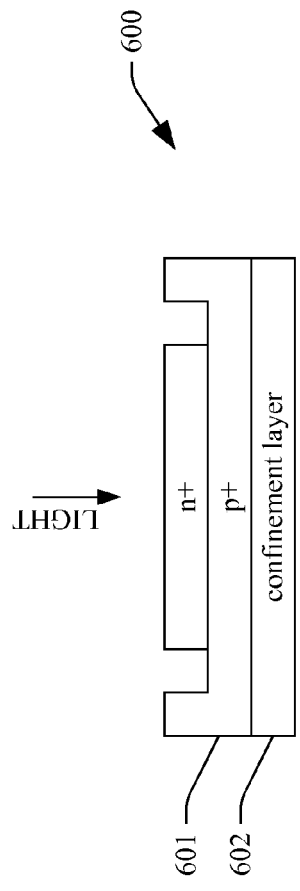
FIG. 6 illustrates another exemplary solar cell that comprises compound semiconductors.

Turning now to FIG. 6, another exemplary solar cell 600 is illustrated. Here, trenches are selectively caused to be placed in a compound semiconductor to generate positive and negative contact pads at a same level. For example, a p-type compound semiconductor layer 601 can be grown on a confinement layer 602. A compound semiconductor layer 604 can be placed upon the p-type compound semiconductor layer 601. Thereafter, trenches can be etched through the second compound semiconductor layer and a central portion can be subjected to n-doping. This combination of trenching and n-doping can create positive pillars that are at the same level on the solar cell as the negative contact pad.

Figure 7:
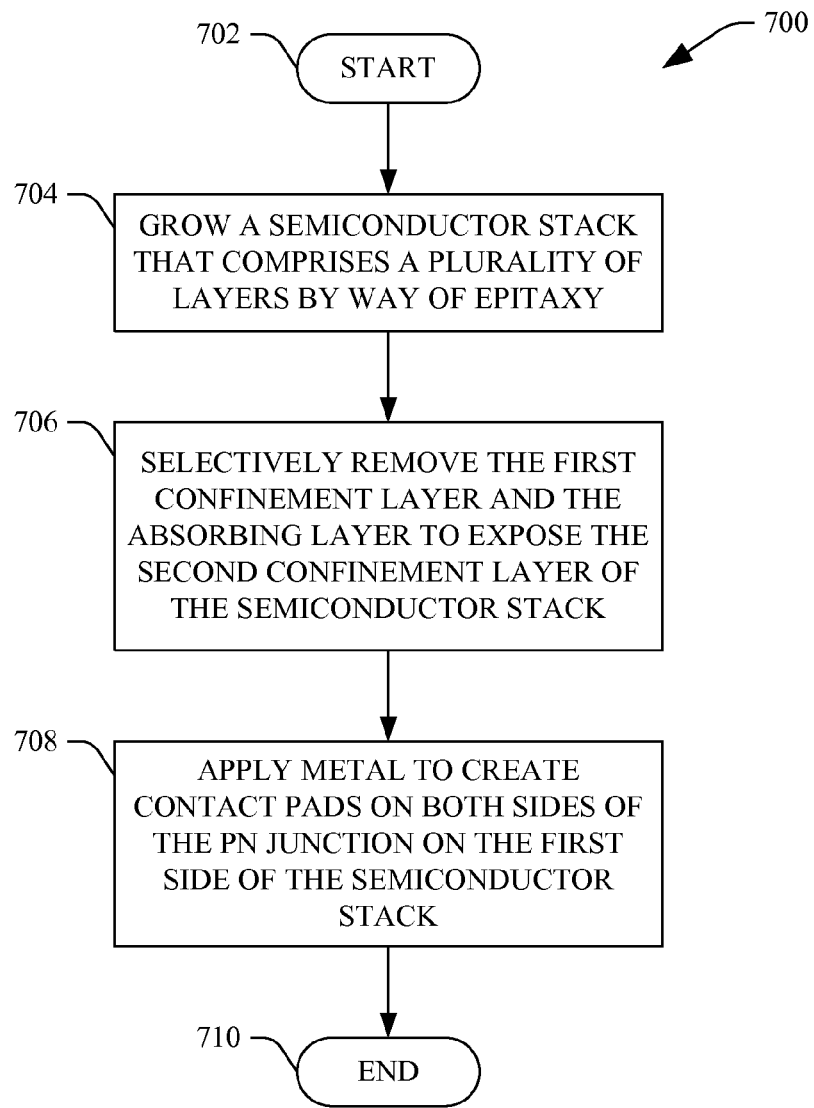
FIG. 7 is a flow diagram that illustrates an exemplary methodology for manufacturing a solar cell that comprises compound semiconductors.

With reference now to FIG. 7, an exemplary methodology 700 that can be employed in connection with manufacturing solar cells is illustrated and described. While the methodology is described as being a series of acts that are performed in a sequence, it is to be understood that the methodology is not limited by the order of the sequence. For instance, some acts may occur in a different order than what is described herein. In addition, an act may occur concurrently with another act. Furthermore, in some instances, not all acts may be required to implement the methodology described herein.

The methodology 700 starts at 702, and at 704 a semiconductor stack that comprises a plurality of layers is grown by way of epitaxy. The plurality of layers can comprise an absorbing layer and first and second confinement layers that surround the absorbing layer.

At 706, the first confinement layer and the absorbing layer are selectively removed to expose the second confinement layer of the semiconductor stack.

At 708, positive and negative metal contact pads are created on a same side (back side) of the solar cell, wherein neither of the positive and negative contact pads is contacted to the absorbing layer of the solar cell. The methodology 700 completes at 710.

It is noted that several examples have been provided for purposes of explanation. These examples are not to be construed as limiting the hereto-appended claims. Additionally, it may be recognized that the examples provided herein may be permutated while still falling under the scope of the claims.

What is claimed is:

1. A solar cell, comprising:
   a plurality of layers of compound semiconductors, the layers comprising:
   a first GaInP layer;
   an n-type GaAs layer that is immediately above and in direct physical contact with the first GaInP layer;
   a p-type GaAs layer that is immediately above and in direct physical contact with the n-type GaAs layer;
   a second GaInP layer that is immediately above and in direct physical contact with the p-type GaAs layer;
   a p-type GaAs contact layer that is immediately above and in direct physical contact with the second GaInP layer; and
   a positive electrical contact, comprised of metal, that is in direct physical contact with the p-type GaAs contact layer; and a negative electrical contact, comprised of metal, that is in direct physical contact with the first GaInP layer, wherein the positive and negative electrical contacts are exposed on a same side of the solar cell.

2. The solar cell of claim 1, wherein the positive electrical contact and the negative electrical contact comprise gold.

3. The solar cell of claim 1, wherein the positive electrical contact and the negative electrical contact comprise chromium.

4. The solar cell of claim 1, wherein the solar cell can bend to a radius of curvature ranging from 2 mm to 10 cm.

5. A method for manufacturing a solar cell, comprising:
   growing a semiconductor stack that comprises a plurality of layers of compound semiconductors that are grown by way of epitaxy, the plurality of layers comprising:
      a first GaInP layer; an n-type GaAs layer that is immediately above and in direct physical contact with the first GaInP layer; a p-type GaAs layer that is immediately above and in direct physical contact with the n-type GaAs layer; a second GaInP layer that is immediately above and in direct physical contact with the p-type GaAs layer; a p-type GaAs contact layer that is immediately above and in direct physical contact with the second GaInP layer; and etching a portion of each of the GaAs contact layer, the second GaInP layer, the p-type GaAs layer, and the n-type GaAs layer, to reach the first GaInP layer;
   adding a positive electrical contact, comprised of metal, that is in direct physical contact with the p-type GaAs contact layer; and adding a negative electrical contact, comprised of metal, that is in direct physical contact with the first GaInP layer, wherein the positive electrical contact and the negative electrical contact are exposed on a same side of the solar cell.

* * * * *